(12) United States Patent
Disney

(10) Patent No.: US 8,236,656 B2
(45) Date of Patent: *Aug. 7, 2012

(54) METHOD AND APPARATUS FOR CONTROLLING A CIRCUIT WITH A HIGH VOLTAGE SENSE DEVICE

(75) Inventor: Donald R. Disney, Cupertino, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/365,081

(22) Filed: Feb. 2, 2012

(65) Prior Publication Data

US 2012/0139012 A1 Jun. 7, 2012

Related U.S. Application Data

(63) Continuation of application No. 12/975,224, filed on Dec. 21, 2010, now Pat. No. 8,120,097, which is a continuation of application No. 12/688,778, filed on Jan. 15, 2010, now Pat. No. 7,872,304, which is a continuation of application No. 12/350,147, filed on Jan. 7, 2009, now Pat. No. 7,696,566, which is a continuation of application No. 11/716,057, filed on Mar. 9, 2007, now Pat. No. 7,491,611, which is a continuation of application No. 11/318,218, filed on Dec. 23, 2005, now Pat. No. 7,205,824, which is a continuation of application No. 10/888,813, filed on Jul. 8, 2004, now Pat. No. 7,002,398.

(51) Int. Cl.
*H01L 21/336* (2006.01)
*H01L 31/119* (2006.01)

(52) U.S. Cl. ................ 438/282; 257/342

(58) Field of Classification Search .......... 257/339–343, 257/409, E29.021, E29.262; 438/157, 282
See application file for complete search history.

(56) References Cited

U.S. PATENT DOCUMENTS 4,263,643 A  4/1981 Koike
(Continued)

FOREIGN PATENT DOCUMENTS

EP  0 585 789 A1  3/1994
(Continued)

OTHER PUBLICATIONS

"SMP 220: PWM Power Supply IC—85-265 VAC Input Isolated, Regulated DC Output", Power Integrations, Inc., Jan. 1996, pp. 2-73-2-80.

(Continued)

*Primary Examiner* — Calvin Lee
(74) *Attorney, Agent, or Firm* — Blakely Sokoloff Taylor & Zafman LLP

(57) ABSTRACT

A high-voltage junction field-effect transistor (JFET) includes a semiconductor substrate, a well region, first, second, and third doped regions, and first, second, and third terminals. The first doped region is disposed in the well region and the second dope region is laterally displaced from the well region. The third doped region is disposed in the well region between the first and second doped regions. A portion of the well region is substantially depleted of free charge carriers when a first voltage between the first and second terminals is greater than or equal to a pinch-off voltage. A voltage output at the third terminal is substantially proportional to the first voltage when the first voltage is less than the pinch-off voltage, and the voltage output at the third terminal is substantially fixed and less than the first voltage when the first voltage is greater than or equal to the pinch-off voltage.

7 Claims, 5 Drawing Sheets

U.S. PATENT DOCUMENTS

| | | | |
|---|---|---|---|
| 4,754,310 A | 6/1988 | Coe | |
| 4,811,075 A | 3/1989 | Eklund | |
| 5,014,178 A | 5/1991 | Balakrishnan | |
| 5,063,313 A | 11/1991 | Kikuda et al. | |
| 5,146,298 A | 9/1992 | Eklund | |
| 5,216,275 A | 6/1993 | Chen | |
| 5,282,107 A | 1/1994 | Balakrishnan | |
| 5,285,369 A | 2/1994 | Balakrishnan | |
| 5,313,082 A | 5/1994 | Eklund | |
| 5,386,136 A | 1/1995 | Williams et al. | |
| 5,438,215 A | 8/1995 | Tihanyi | |
| 5,517,152 A | 5/1996 | Miki et al. | |
| 5,521,105 A | 5/1996 | Hsu et al. | |
| 5,637,898 A | 6/1997 | Baliga | |
| 5,734,564 A | 3/1998 | Brkovic | |
| 5,973,360 A | 10/1999 | Tihanyi | |
| 5,998,833 A | 12/1999 | Baliga | |
| 6,184,555 B1 | 2/2001 | Tihanyi et al. | |
| 6,207,994 B1 | 3/2001 | Rumennik et al. | |
| 6,259,618 B1 | 7/2001 | Liaw et al. | |
| 6,388,286 B1 | 5/2002 | Baliga | |
| 6,414,855 B1 | 7/2002 | Yasuda | |
| 6,462,971 B1 | 10/2002 | Balakrishnan et al. | |
| 6,504,733 B1 | 1/2003 | Watson, III et al. | |
| 6,525,372 B2 | 2/2003 | Baliga | |
| 6,781,194 B2 | 8/2004 | Baliga | |
| 6,865,093 B2 | 3/2005 | Disney | |
| 7,002,398 B2 | 2/2006 | Disney | |
| 7,491,611 B2 * | 2/2009 | Disney | 438/282 |
| 7,696,566 B2 | 4/2010 | Disney | |
| 7,872,304 B2 | 1/2011 | Disney | |
| 2002/0060340 A1 | 5/2002 | Deboy et al. | |
| 2002/0060913 A1 | 5/2002 | Yasuda | |
| 2002/0159276 A1 | 10/2002 | Deboy et al. | |
| 2003/0001548 A1 | 1/2003 | Feldtkeller | |

FOREIGN PATENT DOCUMENTS

| | | |
|---|---|---|
| EP | 1 291 907 A2 | 3/2003 |
| EP | 1 486 844 A2 | 12/2004 |
| EP | 1 615 324 A2 | 1/2006 |
| JP | 06-165485 | 6/1994 |
| JP | 06-169567 | 6/1994 |
| JP | 07-087733 | 3/1995 |
| JP | 2002-517116 | 6/2002 |
| WO | WO 99/62174 | 12/1999 |
| WO | WO 03/050882 A1 | 6/2003 |

OTHER PUBLICATIONS

Fujihira, T., "Theory of Semiconductor Superjunction Devices," Japanese Journal of Applied Physics, vol. 36, Part 1, No. 10, Oct. 1997, pp. 6254-6262.

Fujihira, T., et al., "Simulated Superior Performances of Semiconductor Superjunction Devices," Proceedings of the $10^{th}$ International Symposium on Power Semiconductor Devices & TCs, ISPSD 98, Jun. 3-6, 1998, pp. 423-426.

Alberkrack, J., et al., "Monolithic Offline Switcher," PCIM, May 1999, pp. 55-59.

"Off-Line SMPS Current Mode Controller with integrated 500V Startup Cell," Infineon Technologies AG, Datasheet Version 1.0, May 2003, pp. 1-2.

Clemente, S., "Gate Drive Characteristics and Requirements for Power HEXFET®S," Application Note 937B, HEXFET Designer's Manual, vol. 1: Power MOSFETs Application and Reliability Data, International Rectifier, 1993, pp. 7-14.

"VIPer53DIP, VIPer53SP—Off Line Primary Switch," ST Microelectronics, Dec. 2003, pp. 1-24.

"FSDM565R—Green Mode Fairchild Power Switch (FPS)," Rev. 1.0.1, Fairchild Semiconductor Corporation, Feb. 9, 2004, pp. 1-20.

"CoolSET™-F2: Off-Line SMPS Current Mode Controller with integrated 650V / 800V CoolMOS™," Infineon Technologies AG, Datasheet Version 4.4, Dec. 2003, pp. 1-33.

"CoolSET™-F3: Off-Line SMPS Current Mode Controller with integrated 650V Startup Cell / CoolMOS™," Infineon Technologies AG, Preliminary Datasheet, Version 1.2, May 21, 2004, pp. 1-28.

Millman, J. et al., "Microelectronics," Second Edition, Chapter 4: Field-Effect Transistors, McGraw-Hill, Singapore, 1987, pp. 133-170.

EP 04 25 2903—Partial European Search Report, dated Aug. 20, 2004 (4 pages).

EP 04 25 2903—European Search Report, dated Jan. 4, 2005 (5 pages).

EP 04 25 2903—Summons to Attend Oral Proceedings, dated Feb. 6, 2008 (5 pages).

EP 05 25 4248—European Search Report and Written Opinion, dated Feb. 24, 2010. (6 pages).

EP 07 02 4069—Partial European Search Report mailed Sep. 25, 2008 (6 pages).

EP 07 02 4069—European Search Report mailed Dec. 23, 2008 (6 pages).

EP 07 02 4069—European Office Action, dated Sep. 14, 2011 (5 pages).

EP 10 17 6318—European Search Report, dated Oct. 13, 2010 (3 pages).

JP 2005-199707—Notice of the Reason for Refusal, mailed Oct. 30, 2007 (3 pages).

* cited by examiner

METHOD AND APPARATUS FOR CONTROLLING A CIRCUIT WITH A HIGH VOLTAGE SENSE DEVICE

REFERENCE TO PRIOR APPLICATION

This application is a continuation of U.S. application Ser. No. 12/975,224, filed Dec. 21, 2010, now U.S. Pat. No. 8,120,097, which is a continuation of U.S. application Ser. No. 12/688,778, filed Jan. 15, 2010, now U.S. Pat. No. 7,872,304, which is a continuation of U.S. application Ser. No. 12/350,147, filed Jan. 7, 2009, now U.S. Pat. No. 7,696,566, which is a continuation of U.S. application Ser. No. 11/716,057, filed Mar. 9, 2007, now U.S. Pat. No. 7,491,611, which is a continuation of U.S. application Ser. No. 11/318,218, filed Dec. 23, 2005, now U.S. Pat. No. 7,205,824, which is a continuation of U.S. application Ser. No. 10/888,813, filed Jul. 8, 2004, now U.S. Pat. No. 7,002,398. U.S. application Ser. No. 12/975,224, and U.S. Pat. Nos. 7,872,304, 7,696,566, 7,491,611, 7,205,824 and 7,002,398 are hereby incorporated by reference.

BACKGROUND OF THE INVENTION

1. Field of the Invention

The present invention relates generally to control elements used in electronic circuits and, more specifically, the present invention relates to control elements with high voltage power transistors.

2. Background Information

Two of the primary goals in the design of control elements with integrated power transistors are cost and performance. Cost is generally reduced when the number of external components required in the electronic circuit are reduced, and when smaller, more efficient power transistors are employed. Performance may be improved by adopting a more efficient power transistor, which increases efficiency, and by lowering the manufacturing variance, which allows better control of critical parameters such as the peak current delivered by the power transistor.

A power supply is an example of an electronic circuit that utilizes a control element with power transistor. The start-up function of one known power supply is performed by a resistor, which provides high voltage DC from a bridge rectifier to the control circuit. Unfortunately, the start-up function resistor is expensive, requires a large area in the power supply and lowers supply efficiency by dissipating power continuously, even after the start-up function is completed. A current limit function of the known power supply is provided by a sense resistor that is in series with the source of the power transistor. Drawbacks of this known approach are the cost, size and power dissipation of the sense resistor that is in series with the source of the power transistor.

In another known power supply, a voltage regulator internal to the power supply chip is used to replace the start-up function resistor described above. The voltage regulator in the power supply chip may be turned off after the start-up function is completed, thus eliminating the extra power dissipation inherent to the power supply described above. However, the voltage regulator in the power supply chip consumes a significant area on power supply chip and is also prone to electrical static discharge (ESD) and safe operating area (SOA) damage.

BRIEF DESCRIPTION OF THE DRAWINGS

The present invention detailed illustrated by way of example and not limitation in the accompanying figures.

DETAILED DESCRIPTION

A novel circuit utilizing a control circuit with a high voltage sense element is disclosed. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

The following description uses the example of a power supply to illustrate the benefits of the present invention. It will be apparent to one skilled in the art that the techniques are not limited to use in power supplies but apply to any electronic circuit employing a control element for use in high voltage applications of for example 100 volts or beyond.

In general, a power supply according to embodiments of the present invention includes a high voltage sense element that is included in a substrate with a control circuit. In one embodiment, the high voltage sense element may be an offline transistor with a tap element. An advantage provided with an offline transistor with a tap element according to embodiments of the present invention is that the area utilized for such a tap element is less expensive on a control circuit than on a power transistor. Another advantage is simplification of the power transistor. A further advantage is that the same power transistor design can be used for hybrid applications, which include two or more chips packaged together, and discrete applications, which include a single transistor package.

Figure 1:
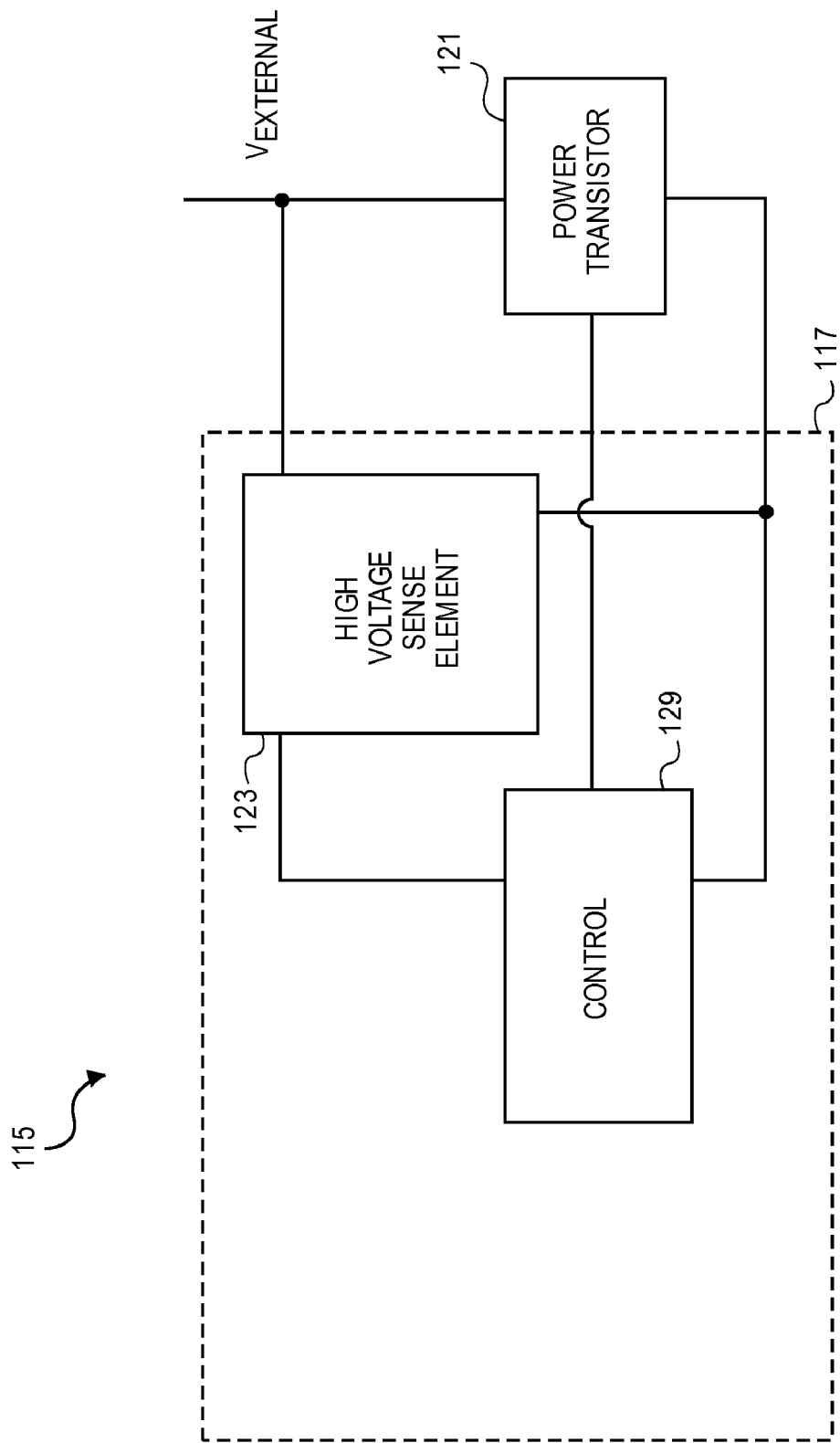
FIG. 1 is a block diagram illustrating one embodiment of a power supply control element coupled to an external voltage and a power transistor in accordance with the teachings of the present invention.

To illustrate, FIG. 1 is a block diagram illustrating generally a power supply control element 115 coupled to an external voltage $V_{EXTERNAL}$ and a power transistor 121. As shown in the depicted embodiment, power supply control element 115 includes a semiconductor substrate 117 on which control circuitry 129 and high voltage sense element 123 are included. In the illustrated embodiment, power transistor 121 is coupled to the external voltage $V_{EXTERNAL}$ and power transistor 121 is controlled in response to control circuitry 129. High voltage sense element 123 is coupled to sense the external voltage $V_{EXTERNAL}$ and control circuitry 129 is in one embodiment coupled to be responsive to the voltage sensed by high voltage sense element 123.

Figure 2:
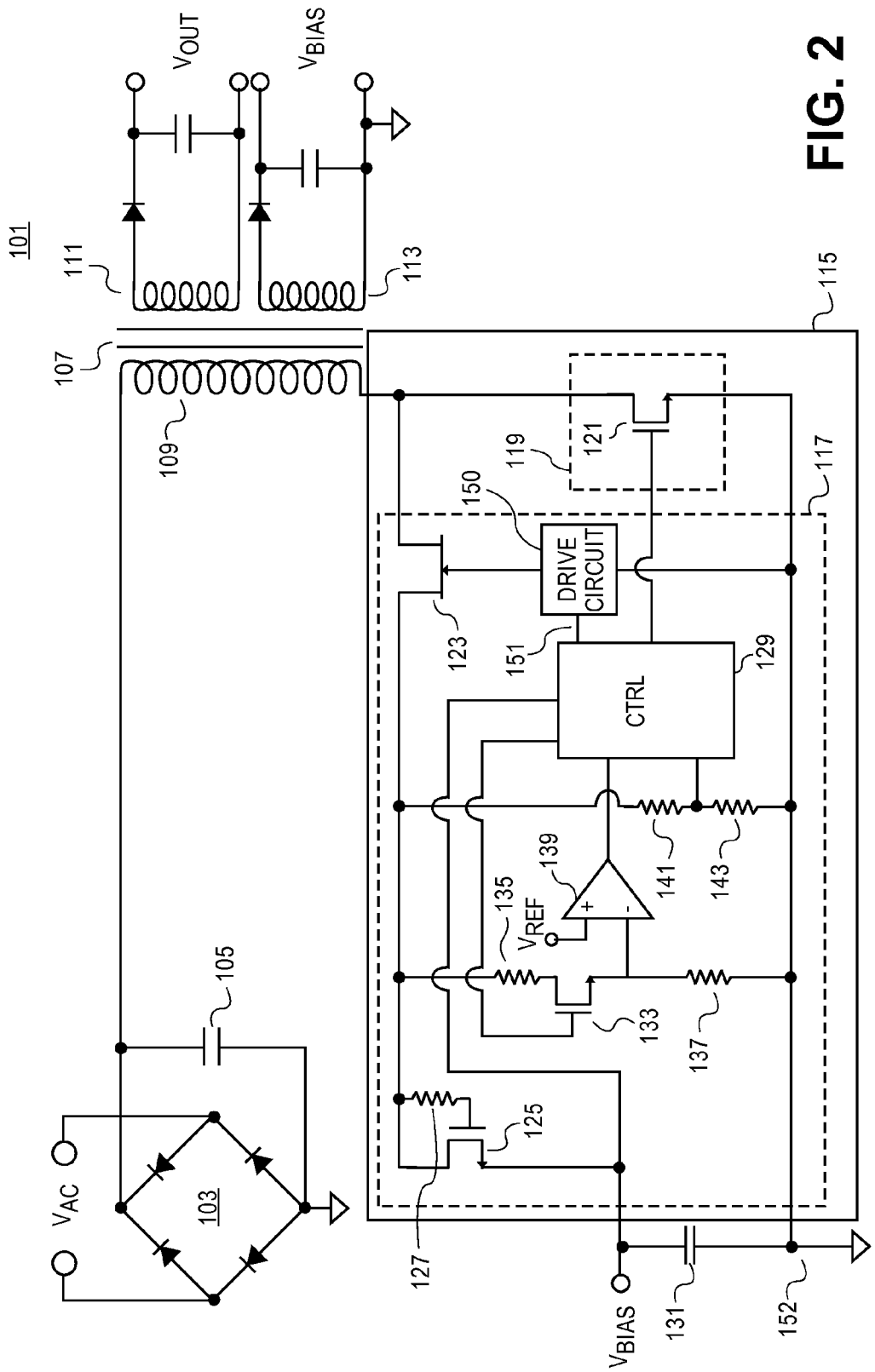
FIG. 2 is a schematic diagram of one embodiment of a power supply including a control circuit having a high voltage sense device in accordance with the teachings of the present invention.

FIG. 2 shows generally a schematic diagram of one embodiment of a power supply 101 including one embodiment of power supply control element 115 according to an embodiment of the present invention. As shown, power supply 101 includes a rectifier 103 coupled to receive and rectify an alternating current (AC) voltage $V_{AC}$. Capacitor 105 is coupled across outputs of rectifier 103 to filter the rectified output of rectifier 103. In one embodiment, an energy transfer element 107 is coupled to receive the rectified voltage from rectifier 103 and capacitor 105 with a primary winding 109. In one embodiment, energy transfer element 107 also includes an output winding 111 and a bias winding 113. Energy is transferred across energy transfer element 107 from primary winding 109 to output winding 111 and bias winding 113 in response to power supply control element 115.

In operation, a control circuitry 129 on a semiconductor substrate 117 generates a drive signal to control the switching of a power transistor 121 to control the transfer of energy from primary winding 109 to output winding 111 and bias winding 113. In one embodiment, control circuitry 129 may include pulse width modulation (PWM) circuitry, cycle skipping circuitry, or other suitable circuitry to control the switching of power transistor 121 to regulate the transfer of energy through energy transfer element 107 in accordance with the teachings of the present invention. In one embodiment, feedback information from the output of power supply 101 is provided with $V_{BIAS}$, which is received by control circuitry 129. In other embodiments, it is appreciated that other known techniques may be used to provide feedback information to the circuitry on substrate 117 in accordance with the teachings of the present invention.

In the embodiment illustrated in FIG. 2, it is noted that power supply control element 115 is shown as a hybrid package, which includes circuitry disposed on a first substrate 117 packaged together with a power transistor 121 disposed on a separate second substrate 119. In another embodiment, it is appreciated for example that power transistor 121 on second substrate 119 can be packaged separately from first substrate 117 in accordance with the teachings of the present invention.

In one embodiment, first substrate 117 includes a high voltage sense device, which in one embodiment is a transistor 123 that includes a first terminal that is coupled to primary winding 109 to receive the same external high voltage that is coupled to power transistor 121. As shown in the embodiment of FIG. 2, transistor 123 includes a second terminal that is coupled to a drive circuit 150, which is coupled to receive a signal 151 from control circuitry 129. In one embodiment, drive circuit 150 is adapted to be responsive to signal 151 to control the operation of transistor 123. As shown in the depicted embodiment, drive circuit 150 is further coupled to ground 152. For purposes of this disclosure, ground is interpreted to be a reference voltage or potential against which all other voltages or potentials of the system are defined or measured. A third terminal of transistor 123 provides a voltage to the other circuitry disposed in substrate 117. In another embodiment, drive circuit 150 is not included in substrate 117 and the second terminal of transistor 123 is therefore coupled directly to ground 152 in that embodiment. In one embodiment, transistor 123 is a junction field effect transistor (JFET) having a drain terminal coupled to primary winding 109, a gate terminal tied to ground 152 and a source terminal serving as a tap terminal, which provides voltage to the other circuitry disposed in substrate 117. In one embodiment, the JFET of transistor 123 is included in a high voltage metal oxide semiconductor field effect transistor (MOSFET).

As will be discussed, the voltage provided at the third terminal or tap terminal of transistor 123 in one embodiment is substantially proportional to the voltage between the first and second terminals of transistor 123 when the voltage between the first and second terminals of transistor 123 is less than a pinch-off voltage of transistor 123. In one embodiment, the voltage provided at the third terminal of transistor 123 is substantially constant and less than the voltage between the first and second terminals of transistor 123 when the voltage between the first and second terminals of transistor 123 is greater than the pinch-off voltage of transistor 123.

As shown in FIG. 2, one embodiment of the circuitry on substrate 117 includes a transistor 125 and a resistor 127 coupled to receive the voltage from the third terminal of transistor 123. In one embodiment, current derived through transistor 125 is coupled to be received by control circuitry 129 to provide power to control circuitry 129 during operation and/or to charge a capacitor 131 at start-up. For example, in one embodiment, when transistor 125 is turned on, current can be drawn from the first terminal of transistor 123 and through the third terminal of transistor 123 to provide a start-up function for control circuitry 129. Similarly, current can be drawn to provide the current for the control circuitry 129 operation, such that a separate power source is not needed and bias winding 113 is eliminated. In one embodiment, after start-up, capacitor 131 in one embodiment can also provide power to control circuitry 129 during operation.

In one embodiment, the circuitry on substrate 117 also includes a resistor 135 having one end coupled to receive the voltage from the third terminal of transistor 123. The other end of resistor 135 is coupled to transistor 133, which is coupled to resistor 137, which is tied to ground 152. A comparator 139 has one input that is coupled to the node between transistor 133 and resistor 137 as shown and another input coupled to receive a reference voltage $V_{REF}$ as shown in the depicted embodiment. In one embodiment, the output of comparator 139 is coupled to control circuitry 129. In operation, transistor 133, comparator 139 and resistors 135 and 137 provide a current limit function, which is utilized by control circuitry 129 to limit and control the current through power transistor 121.

In the embodiment shown in FIG. 2, it is noted that power transistor 121 is illustrated as an N-channel metal oxide semiconductor field effect transistor (MOSFET) for explanation purposes. In other embodiments, it is appreciated that other types of suitable power transistors may be utilized, such as for example a bipolar junction transistor (BJT), an insulated gate field effect transistor (IGFET), a thyristor device, etc.

When the power transistor 121 on substrate 119 is in the on-state, the voltage on the drain of the power transistor 121 is related to the current through power transistor 121 by the on-resistance of the power transistor 121. The voltage at the third terminal of transistor 123 is proportional to the voltage on the drain of power transistor 121, and thus proportional to the current through power transistor 121. By sensing the voltage at the third terminal of transistor 123 and comparing it to a reference level $V_{REF}$, a current limit function is realized in accordance with the teachings of the present invention.

In one embodiment, the circuitry on substrate 117 further includes resistors 141 and 143 coupled between the voltage from the third terminal of transistor 123 and ground 152 to form a voltage divider network. In one embodiment, the node between resistors 141 and 143 is coupled to control circuitry 129 to provide a line sense function, which is utilized by control circuitry 129 to sense the line voltage at primary winding 109.

Figure 3:
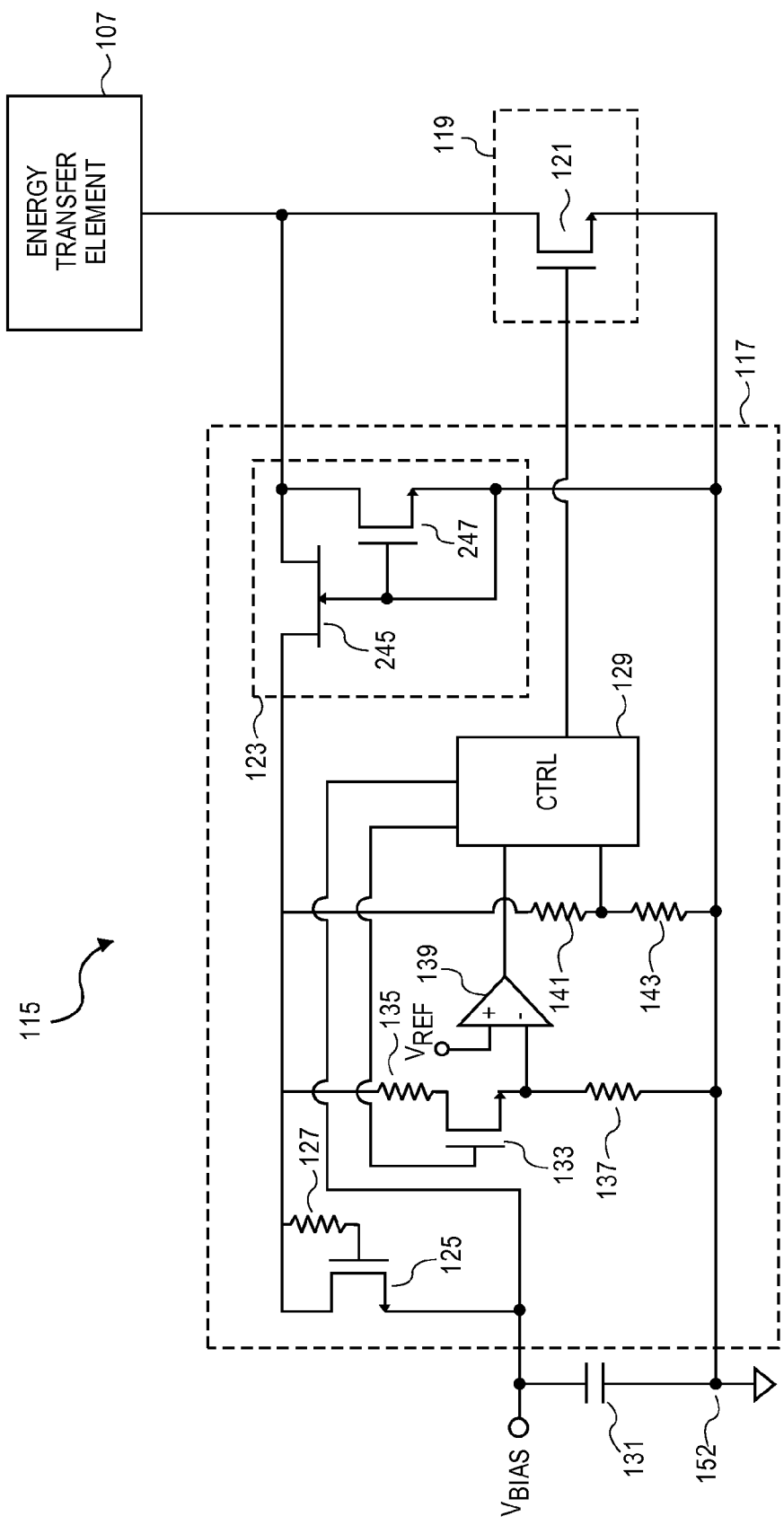
FIG. 3 is a schematic diagram of another embodiment of a power supply including a control circuit having a high voltage sense device in accordance with the teachings of the present invention.

FIG. 3 is a schematic of another embodiment of a power supply control element 115 in accordance with the teachings of the present invention. As shown in the depicted embodiment, the circuitry illustrated in FIG. 3 shares similarities with the circuitry illustrated in FIG. 2. As illustrated in the embodiment depicted in FIG. 3, transistor 123 is an offline transistor, which includes a JFET 245 and a MOSFET 247. A first terminal of transistor 123 fabricated together with other control circuitry on semiconductor substrate 117, which is a separate semiconductor substrate than the semiconductor substrate 119 on which power transistor 121 is fabricated. The transistor 123 is coupled to the same external node from energy transfer element 107 as the drain of a power transistor 121. As illustrated and discussed above in FIG. 2, transistor 123 may be used for several functions, including, but not limited to, start-up, current limit, and line sense.

In one embodiment, MOSFET 247 is coupled to always remain in the off-state with the gate, source and body tied together as shown. Therefore, the source of MOSFET 247 is not floating, but instead is tied to ground 152 in accordance with the teachings of the present invention. With the gate, source and body tied together, the first terminal of transistor 123 may be the drain terminal of MOSFET 247, the second terminal may be the source terminal of MOSFET 247, and the third terminal may provide a tap element that is formed by a JFET 245 connection to the drain of MOSFET 247.

As discussed above, in one embodiment, the voltage at the third terminal or tap element of the offline transistor 123 is proportional to the voltage at the first terminal of transistor 123 up to a certain pinch-off voltage. When the voltage at the first terminal of transistor 123 exceeds the pinch-off voltage, the voltage at the tap element remains relatively constant at a voltage, which can be considerably less than the maximum voltage that may appear at the first terminal of transistor 123. Thus, the tap element of transistor 123 protects the other circuitry on substrate 117 from the high voltages that appear at the first terminal of transistor 123.

In one embodiment shown, the pinch-off voltage of transistor 123 is sufficiently low such that medium-voltage (MV) transistors, such as for example those with breakdown voltages of less than 100 volts, can be used to couple the tap terminal element of transistor 123 to other circuit elements on substrate 117. For example, in the illustrated embodiment, transistors 125, and 133 do not need to be high voltage transistors and may be MV transistors with breakdown voltages in the order of for example 10 to 100 volts while the voltages that appear at the first terminal of transistor 123 may be substantially higher. It is appreciated of course that the voltage ranges provided herewith are for explanation purposes and that MV transistors with other voltage ranges may be utilized in accordance with the teachings of the present invention.

In one embodiment, transistor 123 has a higher breakdown voltage than that of power transistor 121 such that any avalanche condition that occurs in the circuit is handled by power transistor 121. In addition, transistor 123 is inherently more robust than an ordinary offline transistor because transistor 123 includes JFET 245, which does not have a parasitic NPN transistor normally associated with the source/body junction of a MOSFET. Moreover, with the gate, source and body of transistor 123 coupled together and tied to ground 152, transistor 123 is always in the off-state such that transistor 123 never experiences any switching transients, which can degrade the ruggedness of a transistor.

Figure 4:
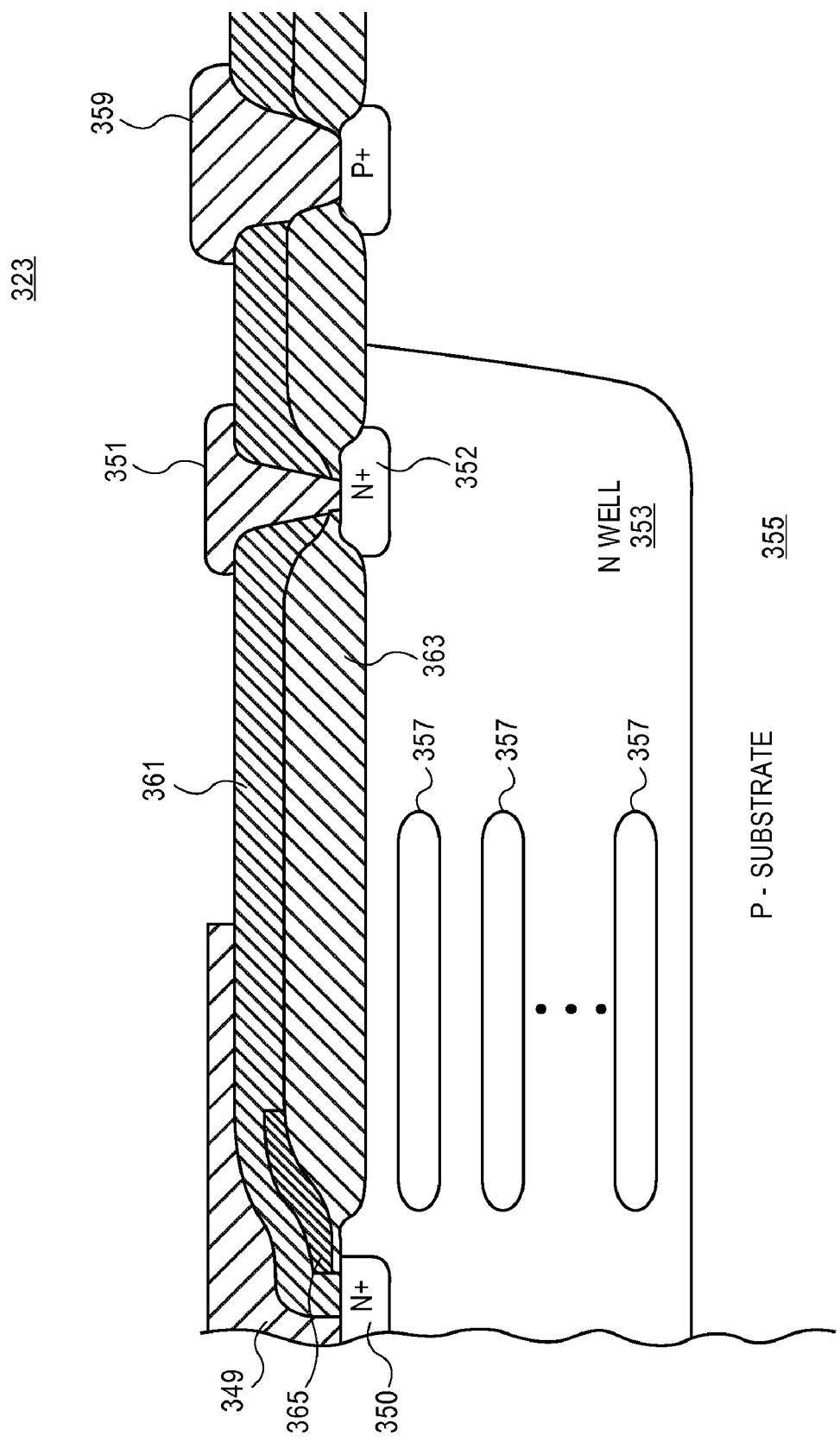
FIG. 4 is a diagram illustrating a cross-sectional side view of one embodiment of a high voltage sense device in accordance with the teachings of the present invention.

FIG. 4 is a diagram illustrating a cross-sectional side view of one embodiment of a high voltage sense device in accordance with the teachings of the present invention. In particular, FIG. 4 shows cross section of a high-voltage JFET 323 in accordance with the teachings of the present invention. The first terminal 349 and third terminal 351 are connected by first terminal doped region 350 and third terminal doped region 352, respectively, in an N well region 353 in a P-type substrate 355. In one embodiment, second terminal 359 and P-type substrate 355 are tied to ground. The embodiment depicted in FIG. 4 also shows that one embodiment includes a field plate 365 disposed between oxide layers 361 and 363 proximate to the region between first terminal 349 and N well 353. In one embodiment, one or more P-type regions 357 are embedded in the N well region 353. As shown in the depicted embodiment, the P-type regions 357 extend across a portion of the N well 353 between the first terminal doped region 350 and the third terminal doped region 352. In one embodiment, P-type regions 357 are electrically coupled to P-type substrate 355. In another embodiment, there may be only a single P-type region 357 in N well 353, which may be buried within N well 353 or adjacent the surface of the N well 353. In yet another embodiment, there may be no P-type region 357.

In one embodiment, when the voltage between the first terminal 349 and the second terminal 359 or P-type substrate 355 (and P-type regions 357) is low, current flows from first terminal 349 to the third terminal 351 through the N well 353. The voltage at third terminal 351 is equal to the voltage at first terminal 341 minus the voltage drop caused by the current flow through N well 353. As the voltage at first terminal 349 is increased, the free charge carrier concentration in N well 353 is depleted by its reverse bias to the P-type substrate 355 and P-type regions 357. When the voltage between the first terminal 349 and the P-type substrate 355 reaches a certain voltage (i.e. the pinch-off voltage), at least a portion of the N well 353 is fully depleted of free charge carriers by the reverse bias. Above this pinch-off voltage, the resistance of the N well 353 between the first and third terminals 349 and 351 increases dramatically, such that the voltage at third terminal 351 is substantially fixed at the pinch-off voltage in accordance with the teachings of the present invention.

Figure 5:
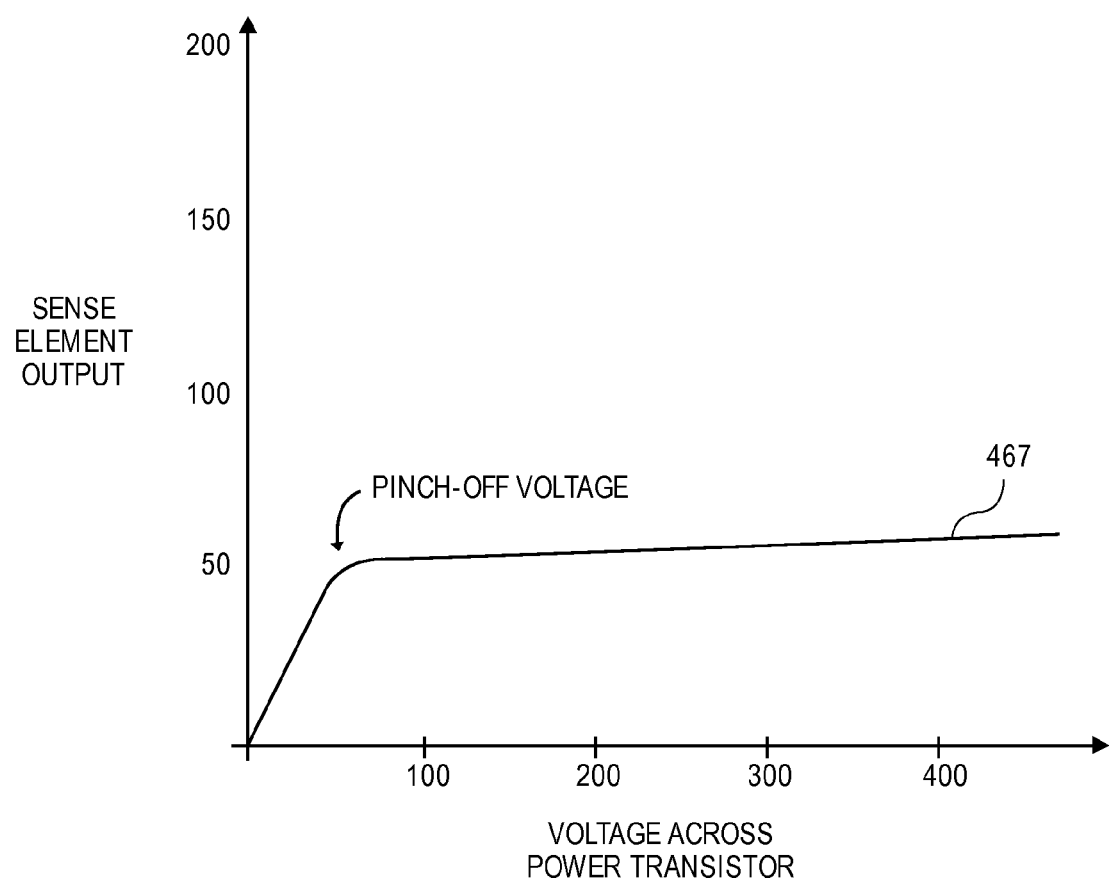
FIG. 5 is a diagram illustrating one embodiment of the relationship between the output voltage of a high voltage sense device as a function of the voltage across a power transistor accordance with the teachings of the present invention.

To illustrate, FIG. 5 is a diagram illustrating one embodiment of the relationship between the output voltage of a high voltage sense element as a function of the voltage across a power transistor accordance with the teachings of the present invention. In particular, plot 467 shows that when the voltage across a power transistor, such as for example the voltage across power transistor 121, is less than the pinch-off voltage, the output voltage of the high voltage sense element, such as for example the voltage at the third terminal of transistor 123, is substantially proportional to the voltage across a power transistor. However, when the voltage across a power transistor is greater than the pinch-off voltage, the voltage output of the high voltage sense element is substantially constant or fixed or increases only slightly with an increase in voltage across the transistor. In this example, the pinch-off voltage is illustrated to be approximately 50 volts. It is appreciated of course that 50 volts is provided for explanation purposes only and that the pinch-off voltage may be a different value in other embodiments in accordance with the teachings of the present invention.

In the foregoing detailed description, the present invention has been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:
1. A high-voltage junction field-effect transistor (JFET), comprising:
   a semiconductor substrate having a first conductivity type;
   a well region formed in the semiconductor substrate, wherein the well region has a second conductivity type;

a first doped region disposed in the well region, wherein the first doped region has the second conductivity type;

a second doped region disposed in the semiconductor substrate laterally displaced from the well region, wherein the second doped region has the first conductivity type;

a third doped region disposed in the well region laterally displaced between the first and second doped regions, wherein the third doped region has the second conductivity type;

a first terminal disposed on the first doped region to electrically couple to the well region;

a second terminal disposed on the second doped region to electrically couple to the semiconductor substrate; and a third terminal disposed on the third doped region to electrically coupled to the well region, wherein at least a portion of the well region is configured to be substantially depleted of free charge carriers when a first voltage between the first and second terminals is greater than or equal to a pinch-off voltage, wherein a voltage output at the third terminal is substantially proportional to the first voltage when the first voltage is less than the pinch-off voltage, and wherein the voltage output at the third terminal is substantially fixed and less than the first voltage when the first voltage is greater than or equal to the pinch-off voltage.

2. The high-voltage JFET of claim 1, further comprising an oxide layer disposed on a surface of the well region between the first and third doped regions.

3. The high-voltage JFET of claim 2, wherein the oxide layer comprises a first and a second oxide layer, the high-voltage JFET further comprising a field plate disposed between the first and second oxide layers proximate to a region between the first terminal and the well region.

4. The high-voltage JFET of claim 1, wherein the first conductivity type is p-type semiconductor material and the second conductivity type is n-type semiconductor material.

5. The high-voltage JFET of claim 1, further comprising a fourth doped region embedded within the well region between the first and third doped regions, wherein the fourth doped region has the first conductivity type.

6. The high-voltage JFET of claim 5, wherein the fourth doped region is electrically coupled to the semiconductor substrate.

7. The high-voltage JFET of claim 1, wherein the second terminal is electrically coupled to a ground reference voltage of the semiconductor substrate.

* * * * *